United States Patent
Oh et al.

(10) Patent No.: US 7,307,008 B2
(45) Date of Patent: Dec. 11, 2007

(54) METHODS OF FORMING INTEGRATED CIRCUIT DEVICES INCLUDING A MULTI-LAYER POLY FILM CELL PAD CONTACT HOLE

(75) Inventors: Yong-Chul Oh, Suwon (KR); Gyo-Young Jin, Anyang (KR)

(73) Assignee: Samsung Electronics Co., Ltd. (KR)

( * ) Notice: Subject to any disclaimer, the term of this patent is extended or adjusted under 35 U.S.C. 154(b) by 341 days.

(21) Appl. No.: 10/622,915

(22) Filed: Jul. 18, 2003

(65) Prior Publication Data

US 2004/0036125 A1 Feb. 26, 2004

(30) Foreign Application Priority Data

Aug. 21, 2002 (KR) ........................ 10-2002-0049548

(51) Int. Cl.
*H01L 21/425* (2006.01)
(52) U.S. Cl. .................... 438/532; 438/233; 438/533
(58) Field of Classification Search ................ 438/233, 438/299, 278, 369, 523, 532, 533
See application file for complete search history.

(56) References Cited

U.S. PATENT DOCUMENTS

| | | | | |
|---|---|---|---|---|
| 5,759,882 A | * | 6/1998 | Kao et al. | 438/202 |
| 5,807,759 A | * | 9/1998 | Naem et al. | 438/300 |
| 6,204,134 B1 | | 3/2001 | Shih | 438/301 |
| 6,255,164 B1 | | 7/2001 | Liu et al. | 438/257 |
| 6,303,431 B1 | | 10/2001 | Linliu | 438/253 |
| 6,306,759 B1 | * | 10/2001 | Yen et al. | 438/637 |
| 6,486,067 B1 | * | 11/2002 | Shen et al. | 438/704 |
| 6,559,013 B1 | * | 5/2003 | Pan | 438/275 |
| 6,570,233 B2 | * | 5/2003 | Matsumura | 257/385 |
| 6,977,204 B1 | * | 12/2005 | Joo | 438/430 |

OTHER PUBLICATIONS

Korean Office Action for application No. 10-2002-0049548 dated Aug. 26, 2004.

* cited by examiner

*Primary Examiner*—Sara Crane
(74) *Attorney, Agent, or Firm*—Myers Bigel Sibley & Sajovec

(57) ABSTRACT

Methods of forming a cell pad contact hole on an integrated circuit include forming adjacent gates on an integrated circuit substrate having a source/drain region extending between the gates. Gate spacers are formed on facing sidewalls of the adjacent gates. A cell pad contact hole is formed aligned to the gates and gate spacers that exposes the source/drain region in the integrated circuit substrate. A first poly film is formed in the cell pad contact hole. An ion region is formed in the source/drain region by ion-implanting through the first poly film and a second poly film is formed on the first poly film that substantially fills the cell pad contact hole.

22 Claims, 4 Drawing Sheets

METHODS OF FORMING INTEGRATED CIRCUIT DEVICES INCLUDING A MULTI-LAYER POLY FILM CELL PAD CONTACT HOLE

RELATED APPLICATION

This application claims priority to Korean Patent Application 2002-49548, filed on Aug. 21, 2002, the contents of which are herein incorporated by reference in their entirety.

BACKGROUND OF THE INVENTION

The present invention relates to integrated circuit devices, and more particularly, to integrated circuit devices including a cell pad contact hole and methods for forming the same.

Integrated circuit (semiconductor) devices are widely used in consumer and commercial applications. Such devices may include cell pad contact holes. Two kinds of known failures in such devices result from an increase and a decrease in the resistance of the cell pad contact hole detected, for example, during Electrical Die Sorting (EDS) testing of the integrated circuit device.

In some cases, a cell pad contact hole may be formed that is smaller than the size specified by a design rule for the integrated circuit device's manufacturing process. As a result, the cell pad contact hole may exhibit a very high resistance. Furthermore, the voltage level of data transmitted from a peripheral circuit region through the cell pad contact hole may be reduced in proportion to the amount of excess resistance of the cell pad contact hole. The integrated circuit device may then have a refresh failure as a result of a reduction of a sensing margin of the device from the voltage drop of the cell pad contact hole.

In other cases, the cell pad contact hole may be formed with a larger size than is required by the design rule. The resulting cell pad contact hole may exhibit a very low resistance. As a result, the high voltage level of data transmitted from the peripheral circuit region through the cell pad contact hole may affect (leak into) an adjacent channel region under a gate of the integrated circuit device because the region between the cell pad contact and the gate may be insufficient given the size of the cell pad contact region. The integrated circuit device may then have a refresh failure as a result of a reduction of sensing margin caused by the voltage leak.

Examples of known methods for fabrication of a cell pad contact hole are described in U.S. Pat. No. 6,204,134 ("the '134 patent") entitled "Method for fabricating a self aligned contact plug," which is incorporated herein by reference.

As described in the '134, the process begins by providing a substrate structure, having a first gate structure and a second gate structure thereon and having a contact area between the first gate structure and the second gate structure. An interlevel dielectric layer is formed over the first gate structure and the second gate structure. The interlevel dielectric layer is patterned to form a self aligned contact opening over the contact area. Impurity ions are implanted into the substrate structure through the self aligned contact opening to form source and drain regions. In the key steps, a high temperature polysilicon film is formed over the source and drain regions, and a furnace doped polysilicon layer is formed over the high temperature polysilicon film (forming a pad poly film of the cell pad contact hole). The furnace doped polysilicon layer and the high temperature polysilicon film are planarized to form a polysilicon self aligned contact plug. This process may reduce the resistance a pad poly film of the cell pad contact hole formed on a cell array area and decrease a leak current from a junction formed around the cell pad contact hole, which may improve design performance of the integrated circuit device.

The first poly film of the pad poly film may be an undoped poly film for curing damage caused by forming the cell pad contact hole on the semiconductor substrate. The second poly film may be a doped poly film to reduce the resistance of the pad poly film of the cell pad contact hole.

The ion implanting process and the key process may, therefore, reduce contact resistance between the pad poly film and the semiconductor substrate. However, the effective channel length of a gate adjacent to the cell pad contact hole may be reduced because ions and/or dopants from the two processes may be diffused into the semiconductor substrate, which may cause a dynamic refresh fail in the semiconductor device.

A conventional semiconductor device having a pad poly film will now be further described with reference to FIG. 1. FIG. 1 is a cross sectional view of semiconductor substrate including a conventional pad poly film. As shown in FIG. 1, a device isolating film 15 is formed on a predetermined region of the semiconductor substrate 10. A gate oxide film (not shown) is disposed on the semiconductor substrate 10 and the device isolating film 15. AND gates 28 are formed on the gate oxide film. Gates 28 are composed of a poly film 20, a Wsi film 23 and a first nitride film 26 sequentially stacked on the gate oxide film. N-type source/drain regions 27 are formed in the semiconductor substrate 10 overlapping with the gates 28. Gate spacers 29 cover the sidewalls of the gates 28 using a second nitride film (not shown).

An insulating film 32 is formed to planarize the semiconductor substrate 10. The insulating film 32 is etched to expose the semiconductor substrate 10 to form a cell pad contact hole 35, wherein the cell pad contact hole 35 is self-aligned to the gates 28 and the gate spacers 29. Subsequently, a third nitride film (not shown) is formed on the top surface of the insulating film 32 and in the cell pad contact hole 35 to form a spacer 38 on the sidewall of the cell pad contact hole 35.

A pad poly film 40 is formed in the cell pad contact hole 35 and on the insulating film 32 and etched back to expose the top surface of the insulating film 32. As a result, the cell pad contact hole 35 is filled with the pad poly film 40.

At this time, the semiconductor device structure may include residue (not shown) of the pad poly film 40 in the regions around the cell pad contact hole 35. Such residue may be subsequently removed with an additional cleaning step, wherein the spacer 38 may act as a buffer film to reduce or prevent damage to the insulating film 32 during the additional cleaning step.

However, using this process, the cell pad contact hole 35 is reduced to a contact having a diameter 1L as a result of formation of the spacer 38. As shown in FIG. 1, the diameter 1L corresponds to a width of the pad poly film 40 contacting the semiconductor substrate 10. Thus, the pad poly film 40 filling the cell pad contact hole 35 has a higher resistance than it would without the spacers 38. When the pad poly film 40 is filled in the cell pad contact hole 35, the spacer 38 does not act as a conductive film.

The resistance of the pad poly film 40 filling the cell pad contact hole 35 may be decreased by forming an impurity region 39 in the substrate 10 through an ion implantation process through the cell pad contact hole 35. However the impurity region 39 may help diffuse ions into adjacent discriminate devices, so that the gates 28 have an effective channel length 2L. The effective channel length 2L can cause a punchthrough between N-type source/drain regions 27 overlapping with the gates 28. As a result, the semiconductor device structure may result in poor refresh operation and deteriorate a performance characteristic of the semiconductor device.

SUMMARY OF THE INVENTION

In some embodiments of the present invention, methods of forming a cell pad contact hole on an integrated circuit include forming adjacent gates on an integrated circuit substrate having a source/drain region extending between the gates. Gate spacers are formed on facing sidewalls of the adjacent gates. A cell pad contact hole is formed aligned to the gates and gate spacers that exposes the source/drain region in the integrated circuit substrate. A first poly film is formed in the cell pad contact hole. An ion region is formed in the source/drain region by ion-implanting through the first poly film and a second poly film is formed on the first poly film that substantially fills the cell pad contact hole.

In other embodiments of the present invention, the gate spacers are formed from a nitride film. The source/drain region may be an N-type source/drain region overlapping the gates. The method may further include forming an insulating film that planarizes undulations from the gates before forming a cell pad contact hole. The first and second poly films may be etched back to expose an upper surface of the insulating film. The first poly film may be conformably formed in the cell pad contact hole. The first poly film may be an undoped poly film.

In further embodiments of the present invention, the first poly film is a doped poly film. The concentration of dopants in the first poly film may be lower than a concentration of dopants in the second poly film. The first poly film may be formed to a thickness selected to provide a desired depth of the ion region.

In other embodiments of the present invention, forming the adjacent gates includes forming a poly film of the gates on the integrated circuit substrate. A tungsten silicide (WSi) film of the gates is formed on the poly film of the gates. A nitride film of the gates is formed on the tungsten silicide film.

In further embodiments of the present invention an additional insulating layer is formed on the first poly film, the second poly film and the insulating layer. A buried contact hole is formed in the additional insulating layer that exposes an upper surface of the second poly film. A contact poly film is formed in the buried contact hole and the contact poly film is etched to expose an upper surface of the additional insulating layer.

In other embodiments of the present invention, integrated circuit devices having a cell pad contact hole include adjacent gates on an integrated circuit substrate having a source/drain region extending between the gates. Gate spacers are provided on facing sidewalls of the adjacent gates. A cell pad contact hole aligned to the gates and gate spacers is provided that exposes the source/drain region in the integrated circuit substrate. A first poly film is in the cell pad contact hole and an ion region is in the source/drain region. A second poly film is on the first poly film that substantially fills the cell pad contact hole. The first poly film may be thinner than the second poly film. The first poly film may have a thickness of about 30 Å to about 300 Å.

In further embodiments of the present invention, semiconductor devices having a cell pad contact hole include a gate oxide film covering on a semiconductor substrate and a device isolating film. Adjacent gates are disposed on the gate oxide film, the gates respectively having a first poly film, a WSi film and a first nitride film, which are sequentially stacked. Gate spacers cover sidewalls of the gates, the gate spacers being formed by using a second nitride film. N-type source/drain regions overlap with the gates. An insulating film covers on the semiconductor substrate, the gates and the gate spacers. A cell pad contact hole is disposed in the insulating film and exposes the semiconductor substrate by self-alignment using the gates and the gate spacers. The cell pad contact hole is filled with a second and a third poly film and an impurity region arranges in the N-type source/drain regions in the semiconductor substrate through an ion implanting process performed between deposition processes of the second and the third poly films.

In other embodiments of the present invention, fabrication methods of a semiconductor device having a cell pad contact hole include preparing a semiconductor substrate having an device isolating film, adjacent two gates, gate spacers, and an insulating film for planazing the undulation caused by the gates and the gate spacers, wherein N-type source/drains are formed in the semiconductor substrate between formation processes of the two gates and the gate spacers. A cell pad contact hole self-aligned to the gates and the gate spacers is formed in the insulating film so that the semiconductor substrate is exposed. A second poly film is conformably formed in the cell pad contact hole. An ion region is formed through an ion implanting process performed on the second poly film. A third poly film is formed on the second poly film and the second and the third poly films are etched back to expose the upper surface of the insulating film, so that the cell pad contact hole is filled with the second and the third poly films.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "on" or "connected to" or "coupled to" another element, it can be directly on, connected to or coupled to the other element or intervening layers or elements may also be present. In contrast, when an element is referred to as being "directly on" or "directly connected to" or "directly coupled to" another element, there are no intervening layers or elements present. The relative thickness of layers in the illustrations may be exaggerated for purposes of describing the present invention. Furthermore, relative terms, such as beneath or lower (and above/upper), may be used herein to describe an element's relationship to another as illustrated in the figures. It will be understood that these terms are intended to encompass different orientations of the elements in addition to the orientation depicted in the figures. For example, if a figure is inverted, the elements described as "beneath" other elements would be oriented "above" these other elements. The relative terms are, therefore, intended to encompass all possible arrangements of the elements and not just the ones shown in the figures.

Figure 2A:
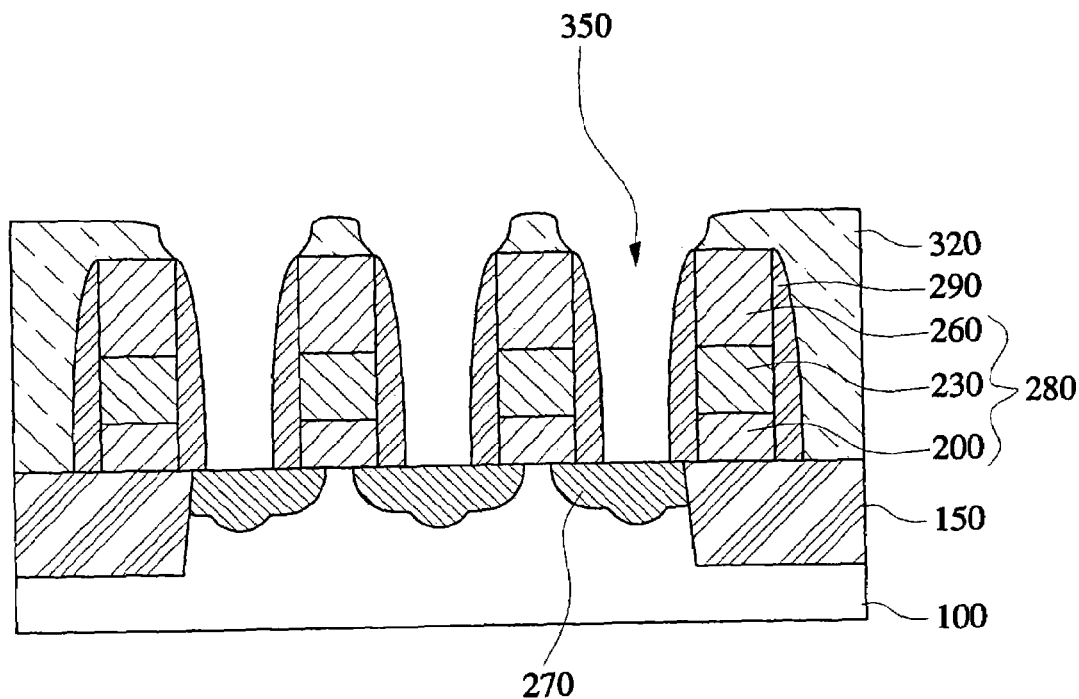
FIGS. 2A-2D are schematic cross-sectional views illustrating methods of forming an integrated circuit device having a cell pad contact hole according to some embodiments of the present invention.
Figure 2B:
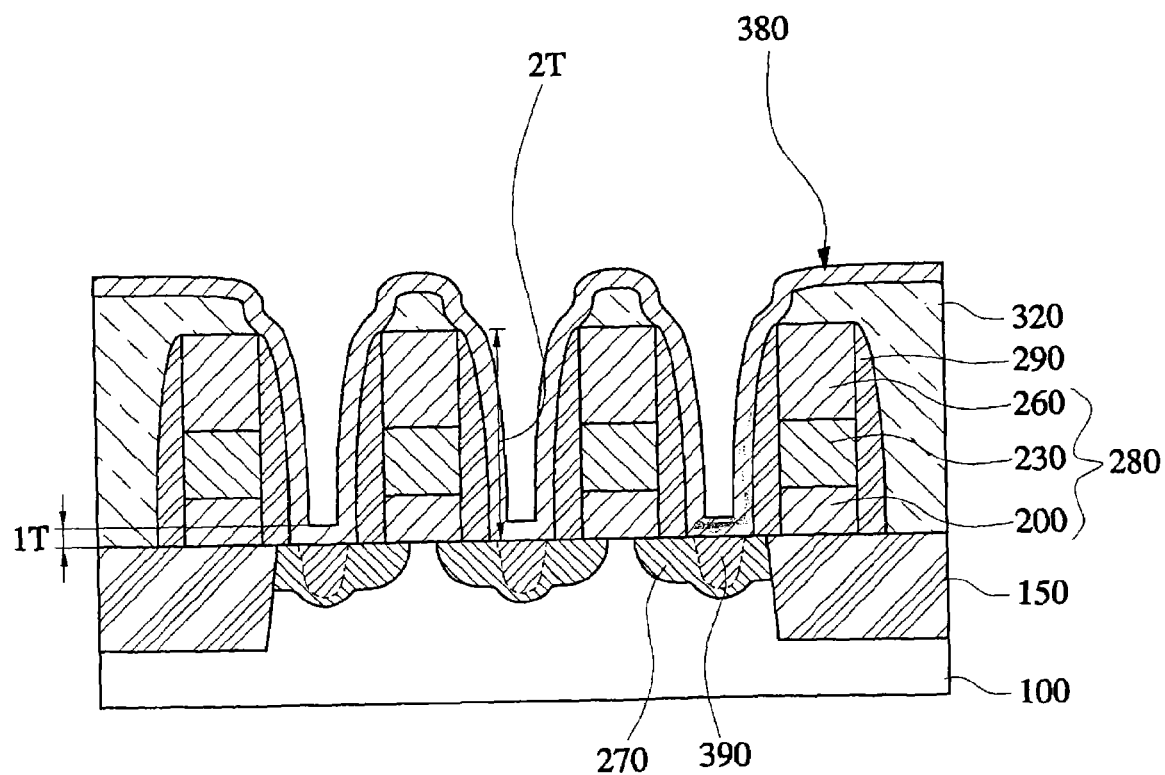
Figure 2C:
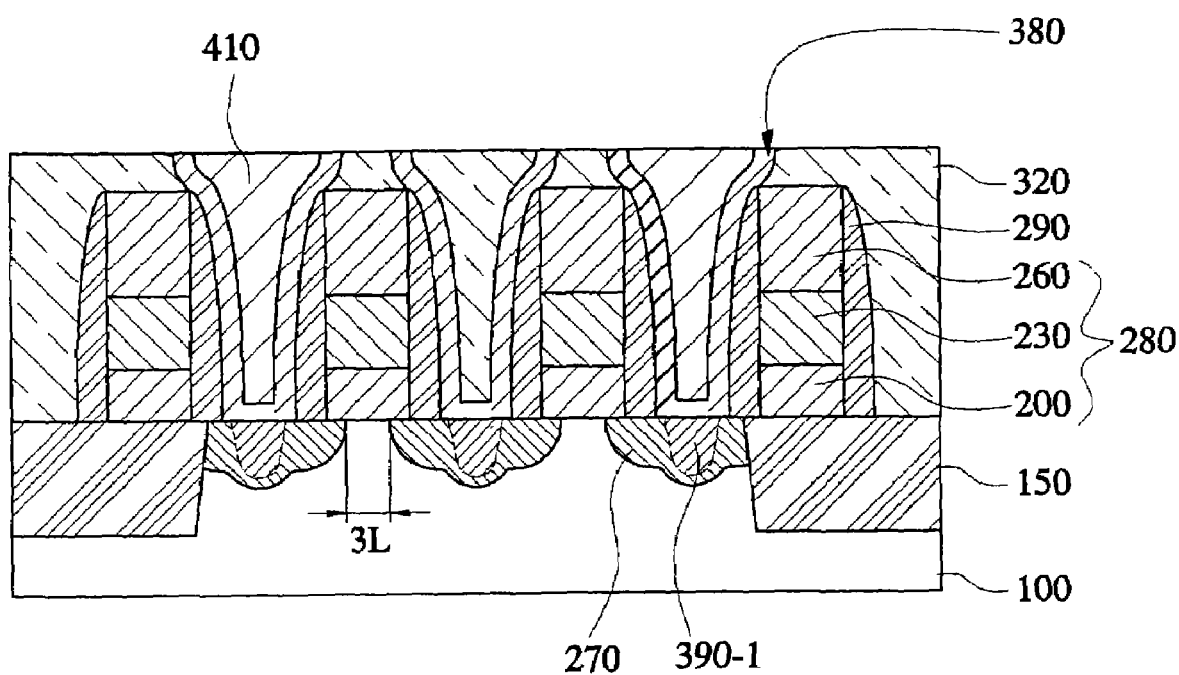

Embodiments of the present invention will now be described with reference to the cross-sectional views of FIGS. 2A-2D. Referring first to FIGS. 2A through 2C, a device isolating film 150 is formed in an integrated circuit (semiconductor) substrate 100. A gate oxide film covers the device isolating film 150 and the integrated circuit substrate 100. A plurality of gates 280 are disposed on predetermined regions of the gate oxide film. As shown in the embodiments of FIGS. 2A-2C, the gates 280 include a first poly film 200, a WSi film 230 and a first nitride film 260. Gate spacers 290 covers sidewalls of the gates 280. In some embodiments of the present invention, the gate spacers 290 are formed from of a second nitride film.

For the embodiments illustrated in FIGS. 2A-2D, N-type source/drains 270 are arranged in the integrated circuit substrate 100. An insulating film 320 is formed on the surface of the integrated circuit substrate 100. A self-aligning cell pad contact hole 350 is disposed between the gates 280 in the insulating film 320.

As shown in FIGS. 2B and 2C, a second poly film 380 (first poly film in the cell pad contact hole 350) and a third poly film 410 (second poly film in the cell pad contact hole 350) are deposited and form a stacked structure in the cell pad contact hole 350. As shown in FIG. 2B, an impurity region 390 is formed in the integrated circuit substrate 100, for example, through an ion implanting process performed between deposition processes of the second and third poly films 380, 410. As a result, the impurity region 390 is formed in the N-type source/drain regions 270.

Further aspects of some embodiments of methods for forming the structure shown in FIG. 2C and described above will now be described with reference to FIGS. 2A through 2C.

Referring first to FIG. 2A, an integrated circuit substrate 100 having a device isolating film 150 is prepared. A gate oxide film (not shown) is formed on the integrated circuit substrate 100 and the device isolating film 150. Subsequently, adjacent gates 280 are formed on predetermined regions of the gate oxide film. The illustrated gates 280 are formed as a multi-layer structure including a first poly film 200, a WSi film 230 and a first nitride film 260. N-type source/drain regions 270 are then formed by ion implantation. In addition, gate spacers 290 are formed on sidewalls of the gates 280. The gate spacers are formed using a second nitride film. A first insulating film 320 is formed on the integrated circuit substrate 100 to planarize undulations (i.e., reduce height variations) in the surface of the integrated circuit device 100 from formation of the gates 280 and the gate spacers 290. The first insulating film 320 is etched to form the cell pad contact hole 350, which is self-aligned to the gates 280 and the gate spacers 290. As a result, the gate spacers 290 are exposed in the cell pad contact holes 350 as shown in FIG. 2A. The fabrication process described up through the formation of the cell pad contact hole 350 is similar to that of the prior art.

In some embodiments of the present invention, the cell pad contact hole 350 is formed by controlling an etching recipe as the WSi film 230 may be exposed due to impact of the etching process on the gate spacers 290.

FIG. 2B is a cross sectional view of the integrated circuit substrate 100 having a second poly film according to some embodiments of the present invention. As shown in FIG. 2B, the second poly film 380 is formed in the cell pad contact hole 350 and on the first insulating film 320. An ion implantation process may be performed on the second poly film 380. The amount of ions implanted to the gate spacers 290 during the implantation process is smaller than the number implanted toward the bottom of the cell pad contact hole 350 as a result of the depth of the cell pad contact hole 350 and an angle used for an ion implanting gun, toward the integrated circuit substrate 100, during the ion implanting process.

Given the angle used of the ion implanting gun, an ion-implanting unbalance may be caused between the sidewall of the cell pad contact hole 350 and the integrated circuit substrate 100 that is affected by differences in thicknesses of the second poly film 380 in the cell pad contact hole 350. More particularly, as shown in FIG. 2B, a generally flat thickness 1T of the second poly film 380 is formed on the bottom of the cell pad contact hole 350 and a vertical thickness 2T of the second poly film 380 is formed on the gate spacers 290.

The ion implanting process through the cell pad contact hole 350 forms an impurity region 390 in the N-type source/drain regions 270 of the integrated circuit substrate 100. A width of the impurity region 390 is smaller than a width of the bottom of the cell pad contact hole 350 because the second poly film 380 acts as a buffer film against the implantation of ions through the cell pad contact hole 350. In addition, a depth of the impurity region 390 in the integrated circuit substrate 100 may be controlled by changing the thickness of the second poly film 380.

FIG. 2C is a cross sectional view of the integrated circuit substrate 100 having a pad poly film according to some embodiments of the present invention. As shown in FIG. 2C, a third poly film 410 is formed on the second poly film 380. An etch back process is performed on the second poly film 380 and the third poly film 410 to expose the top surface of the first insulating film 320. As a result, the cell pad contact hole 350 is filled with the second poly film 380 and the third poly film 410 to define a pad poly film in the cell pad contact hole 350. The process used for filling the cell pad contact hole 350 may be similar to the conventional process for forming the pad poly film 40 of FIG. 1. However, as seen in the illustrated embodiments of FIG. 2C, the pad poly film includes both the second poly film 380 and the third poly film 410 as contrasted with the single poly film 40 of FIG. 1.

In some embodiments of the present invention, the second poly film 380 is thinner than the third poly film 410. The second poly film 380 may have a thickness of about 30 to about 300 Å. The third poly film 410 may be buried in the cell pad contact hole 350. To reduce or prevent diffusion of the impurity region 390 into the bottom of the gate spacers 290, the second poly film 380 may be formed with a lower concentration than the third poly film 410 or may be formed using an undoped film.

A concentration difference between the second poly film 380 and the third poly film 410 may result in preventing or reducing direct diffusion into the integrated circuit substrate 100 of dopants in the third poly film 410. In other words, even though a concentration of the impurity region 390 (FIG. 2B) may be changed to result in an impurity region 390-1 (FIG. 2C) in the N-type source/drain regions, owing to diffusion of some portion of the dopants, the resulting gates 280 have an effective channel length 3L as the respective size of the N-type source/drain regions may not, as a whole, be varied using the second poly film 380.

Figure 2D:
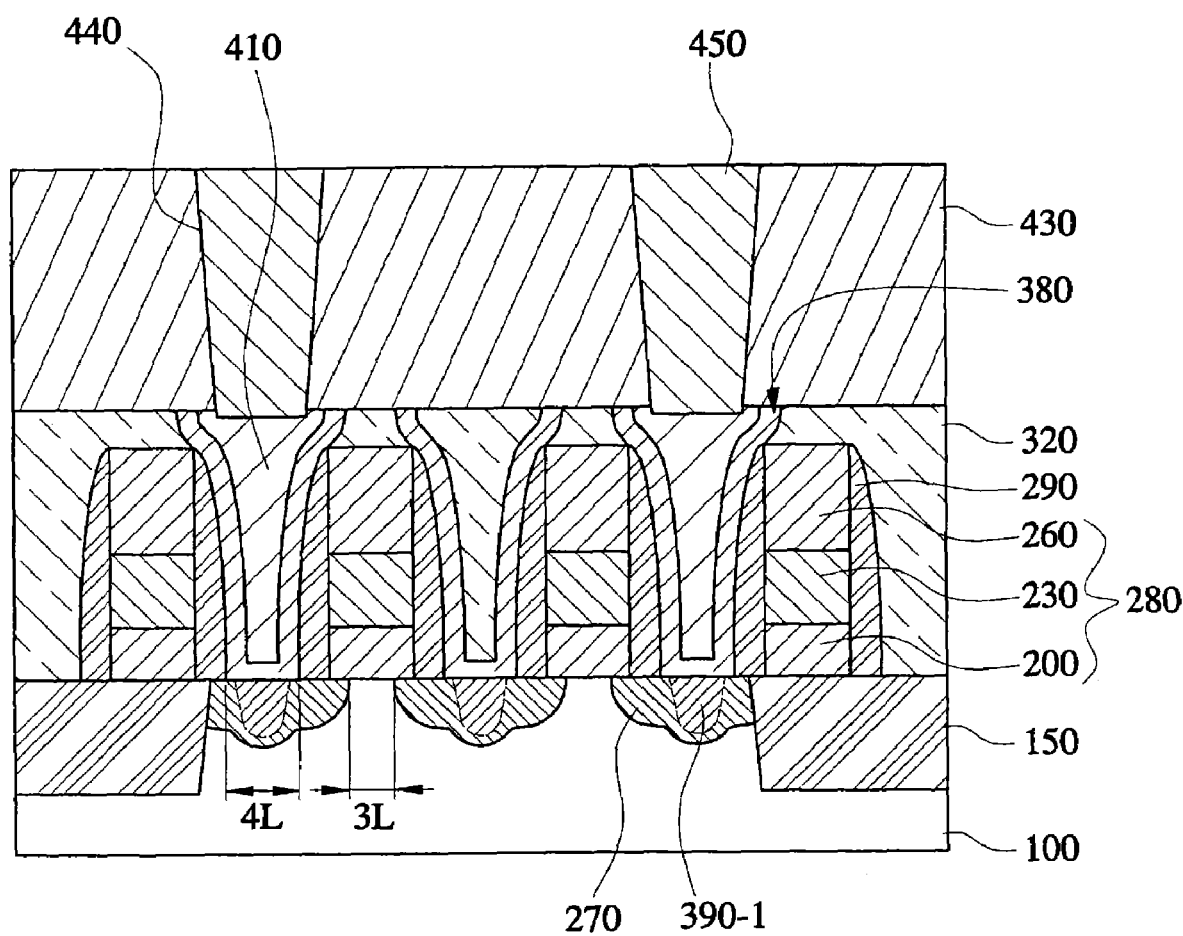

FIG. 2D is a cross sectional view of an integrated circuit substrate 100 having a buried contact poly film according to some embodiments of the present invention. As shown in FIG. 2D, a second insulating film 430 is formed on the second and third poly films 380, 410. A buried contact (BC) hole 440 is formed in the second insulating film 430 to expose a portion of the upper surface of the pad poly film 380, 410. A buried contact poly film 450 is formed in the buried contact hole 440 and on the second insulating film 430. The BC poly film 450 is etched back to expose the upper surface of the second insulating film 430. As a result, the buried contact hole 440 is filled with the buried contact poly film 450.

It will be understood that various fabrication processes following formation of the buried contact 440 of embodiments of the present invention may occur in a manner known to those of skill in the art of fabricating integrated circuit devices.

Figure 1:
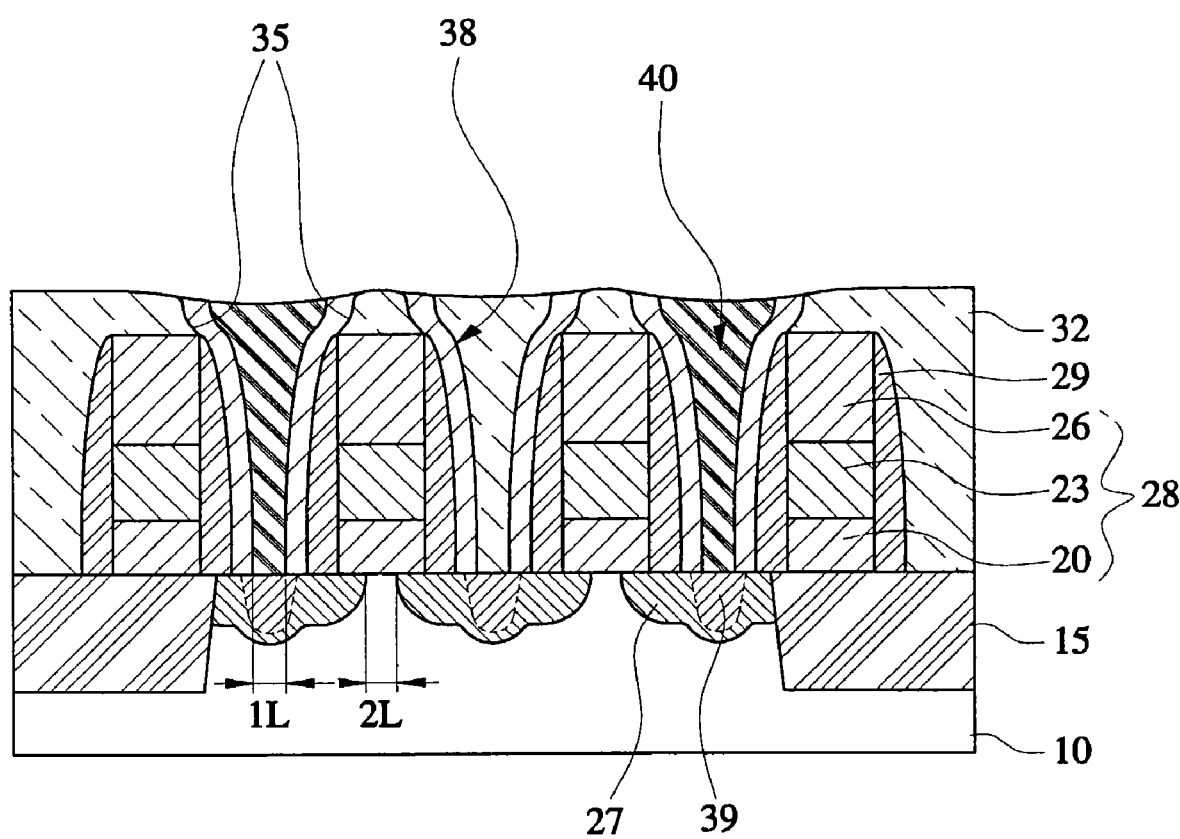
FIG. 1 is a schematic cross-sectional view illustrating an integrated circuit device having a conventional cell pad contact hole.

As described above, for some embodiments of the present invention, the effective channel length 3L formed under the gate 280 (FIG. 2C) may be increased in size in comparison with the 2L channel length of the conventional semiconductor device shown in FIG. 1. As a result, the integrated circuit device may be provided N-source/drain regions 270 capable of preventing or reducing punchthrough caused by an external applied power. Such a reduction or prevention of punchthrough may reduce failures related to dynamic refresh of the integrated circuit device.

In various embodiments of the present invention, dopants existing in the etched third poly film 410 are diffused toward the second poly film 380, so that the second poly film 380 is changed as a doped poly film. Thus, the pad poly film of some embodiments of the present invention has a diameter 4L (FIG. 2D) increased in comparison with the pad poly film 40 of the conventional device of FIG. 1 because the pad poly film includes the second/third poly films 380 and 410. In other words, as the nitride film spacer 38 of the prior art covers the sidewall of the cell pad contact hole 35, the integrated circuit device of some embodiments of the present invention may ensure a space on the bottom of the cell pad contact hole 350 as thick of the spacer 38 of the prior art. Thus, the respective diameter 4L of the cell pad contact hole 350 may decrease the loss of signal (voltage) strength of data going through the cell pad contact holes 350. This may reduce failures related to static refresh of the integrated circuit device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a cell pad contact hole on an integrated circuit, comprising:
    forming adjacent gates on an integrated circuit substrate having a source/drain region extending between the gates;
    forming gate spacers on facing sidewalls of the adjacent gates;
    forming a cell pad contact hole aligned to the gates and gate spacers that exposes the source/drain region in the integrated circuit substrate;
    forming a first poly film in the cell pad contact hole;
    forming a region in the source/drain region by ion-implanting through the first poly film; and
    forming a second poly film on the first poly film that substantially fills the cell pad contact hole, wherein a concentration of dopants in the first poly film is lower than a concentration of dopants in the second poly film.

2. The method of claim 1 wherein the gate spacers are formed from a nitride film.

3. The method of claim 1 wherein the source/drain region comprises an N-type source/drain region overlapping the gates.

4. The method of claim 1 further comprising forming an insulating film that planarizes undulations from the gates before forming a cell pad contact hole.

5. The method of claim 4 further comprising etching the first and second poly films to expose an upper surface of the insulating film.

6. The method of claim 4 wherein forming the first poly film comprises conformably forming the first poly film in the cell pad contact hole.

7. The method of claim 4 wherein the first poly film comprises an undoped poly film.

8. The method of claim 4 wherein the first poly film comprises a doped poly film.

9. The method of claim 4 wherein forming the first poly film comprises forming the first poly film to a thickness selected to provide a desired depth of the region formed by ion implanting.

10. The method of claim 4 wherein forming the adjacent gates comprises:
    forming a poly film of the gates on the integrated circuit substrate;
    forming a tungsten silicide (WSi) film of the gates on the poly film of the gates; and
    forming a nitride film of the gates on the tungsten silicide film.

11. The method of claim 4 further comprising:
    forming an additional insulating layer on the first poly film, the second poly film and the insulating layer;
    forming a buried contact hole in the additional insulating layer that exposes an upper surface of the second poly film;
    forming a contact poly film in the buried contact hole; and
    etching the contact poly film to expose an upper surface of the additional insulating layer.

12. A method of forming a cell pad contact hole on an integrated circuit, comprising:
    forming adjacent gates on an integrated circuit substrate and forming a source/drain region extending between the gates;
    forming gate spacers on facing sidewalls of the adjacent gates;
    forming a cell pad contact hole aligned to the gates and gate spacers that exposes the source/drain region in the integrated circuit substrate;
    forming a first poly film in the cell pad contact hole;
    forming a region in the source/drain region by ion-implanting through the first poly film; and
    forming a second poly film on the first poly film that substantially fills the cell pad contact hole, wherein a concentration of dopants in the first poly film is lower than a concentration of dopants in the second poly film.

13. The method of claim 12 wherein the gate spacers are formed from a nitride film.

14. The method of claim 12 wherein the source/drain region comprises an N-type source/drain region overlapping the gates.

15. The method of claim 12 further comprising forming an insulating film that planarizes undulations from the gates before forming a cell pad contact hole.

16. The method of claim 15 further comprising etching the first and second poly films to expose an upper surface of the insulating film.

17. The method of claim 15 wherein forming the first poly film comprises conformably forming the first poly film in the cell pad contact hole.

18. The method of claim 15 wherein the first poly film comprises an undoped poly film.

19. The method of claim 15 wherein the first poly film comprises a doped poly film.

20. The method of claim 15 wherein forming the first poly film comprises forming the first poly film to a thickness selected to provide a desired depth of the region formed by ion implanting.

21. The method of claim 15 wherein forming the adjacent gates comprises:

forming a poly film of the gates on the integrated circuit substrate;

forming a tungsten silicide (WSi) film of the gates on the poly film of the gates; and forming a nitride film of the gates on the tungsten silicide film.

22. The method of claim 15 further comprising:

forming an additional insulating layer on the first poly film, the second poly film and the insulating layer;

forming a buried contact hole in the additional insulating layer that exposes an upper surface of the second poly film;

forming a contact poly film in the buried contact hole; and etching the contact poly film to expose an upper surface of the additional insulating layer.

* * * * *